United States Patent
Cheng et al.

(10) Patent No.: US 12,513,981 B2
(45) Date of Patent: Dec. 30, 2025

(54) SEMICONDUCTOR DEVICE

(71) Applicant: Vanguard International Semiconductor Corporation, Hsinchu (TW)

(72) Inventors: Wei-Chih Cheng, Tainan (TW); Chia-Hao Lee, Hsinchu County (TW); Chih-Cherng Liao, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 456 days.

(21) Appl. No.: 18/098,720

(22) Filed: Jan. 19, 2023

(65) Prior Publication Data

US 2024/0250085 A1 Jul. 25, 2024

(51) Int. Cl.
*H10D 84/84* (2025.01)
*H01L 23/29* (2006.01)
*H01L 23/31* (2006.01)
*H10D 30/47* (2025.01)
*H10D 62/824* (2025.01)
*H10D 62/85* (2025.01)
*H10D 64/27* (2025.01)

(52) U.S. Cl.
CPC ........... *H10D 84/84* (2025.01); *H01L 23/291* (2013.01); *H01L 23/3171* (2013.01); *H10D 30/475* (2025.01); *H10D 62/824* (2025.01); *H10D 62/8503* (2025.01); *H10D 64/518* (2025.01)

(58) Field of Classification Search
CPC .................. H10D 30/47–485; H10D 30/015
See application file for complete search history.

(56) References Cited

U.S. PATENT DOCUMENTS

| | | | |
|---|---|---|---|
| 9,837,523 B2 | 12/2017 | Wong | |
| 11,043,563 B2 | 6/2021 | Lin | |
| 11,398,546 B2 | 7/2022 | Wu | |
| 2002/0003256 A1 | 1/2002 | Maegawa | |
| 2009/0032820 A1* | 2/2009 | Chen | H10D 30/475 |
| | | | 257/E29.246 |
| 2012/0235156 A1* | 9/2012 | Kuraguchi | H10D 30/4755 |
| | | | 257/E29.264 |
| 2013/0020614 A1* | 1/2013 | Lu | H10D 64/411 |
| | | | 257/E21.407 |

(Continued)

FOREIGN PATENT DOCUMENTS

| | | |
|---|---|---|
| CN | 112802893 | 5/2021 |
| TW | I754096 B | 2/2022 |

*Primary Examiner* — Christine S. Kim
*Assistant Examiner* — Cole Leon Lindsey
(74) *Attorney, Agent, or Firm* — Winston Hsu

(57) ABSTRACT

A semiconductor device includes a semiconductor channel layer and a semiconductor barrier layer disposed on a substrate. A passivation layer covers the semiconductor barrier layer. A first gate electrode and a second gate electrode are laterally separated from each other and at least partially disposed in the passivation layer respectively. Along a first direction, a first gate length of the first gate electrode is less than a second gate length of the second gate electrode. A source electrode and a drain electrode are disposed on the semiconductor channel layer. The second gate electrode is electrically connected to the source electrode. The first gate electrode and the second gate electrode are electrically isolated from each other.

19 Claims, 9 Drawing Sheets

(56) References Cited

U.S. PATENT DOCUMENTS

2014/0375372 A1* 12/2014 Ikeda ................. H03K 17/74
                                              327/333
2021/0320197 A1* 10/2021 Tang .................. H10D 64/411

* cited by examiner

SEMICONDUCTOR DEVICE

BACKGROUND OF THE INVENTION

1. Field of the Invention

The present disclosure relates generally to semiconductor devices, and in particular to semiconductor devices integrating high electron mobility transistors.

2. Description of the Prior Art

In semiconductor technology, group III-V compound semiconductors may be used to construct various integrated circuit (IC) devices, such as high-power field-effect transistors (FETs), high-frequency transistors, or high electron mobility transistors (HEMTs). A HEMT is a field effect transistor having a two-dimensional electron gas (2DEG) layer close to a junction between two materials with different energy gaps (i.e., a hetero-junction). The 2DEG layer is used as the transistor channel instead of a doped region, as is generally the case for metal oxide semiconductor field effect transistors (MOSFETs). Compared with MOSFETs, HEMTs have a number of attractive properties, such as high electron mobility and the ability to transmit signals at high frequencies.

HEMTs usually have normally-off type and normally-on type. During the fabrication, HEMTs may be affected by the process (such as an etching process) to reduce electric performance or uniformity. Although existing HEMTs have been adequate for their intended purposes, they have not been entirely satisfactory in all respects.

SUMMARY OF THE INVENTION

In view of this, the present disclosure provides a semiconductor device that integrates a normally-off HEMT and a normally-on HEMT, and includes two gate electrodes disposed in a passivation layer. The stress of the passivation layer applying to a first gate electrode is different from the stress of the passivation layer applying to a second gate electrode, thereby adjusting the threshold voltage of the normally-off HEMT and the threshold voltage of the normally-on HEMT in the semiconductor device.

According to an embodiment of the present disclosure, a semiconductor device is provided and includes a substrate, a semiconductor channel layer, a semiconductor barrier layer, a passivation layer, a first gate electrode, a second gate electrode, a source electrode, and a drain electrode. The semiconductor channel layer and the semiconductor barrier layer are disposed on the substrate. The passivation layer is disposed to cover the semiconductor barrier layer. The first gate electrode and the second gate electrode are laterally separated from each other and disposed in the passivation layer. In a first direction, a first gate length of the first gate electrode is smaller than a second gate length of the second gate electrode. The source electrode and the drain electrode are disposed on the semiconductor channel layer. In addition, the second gate electrode is electrically connected to the source electrode. The first gate electrode and the second gate electrode are electrically isolated from each other.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Aspects of the present disclosure are best understood from the following detailed description when read with the accompanying figures. It is noted that, in accordance with the standard practice in the industry, various features may not be drawn to scale. In fact, the dimensions of the various features may be arbitrarily increased or reduced for clarity of discussion.

DETAILED DESCRIPTION

Figure 1:
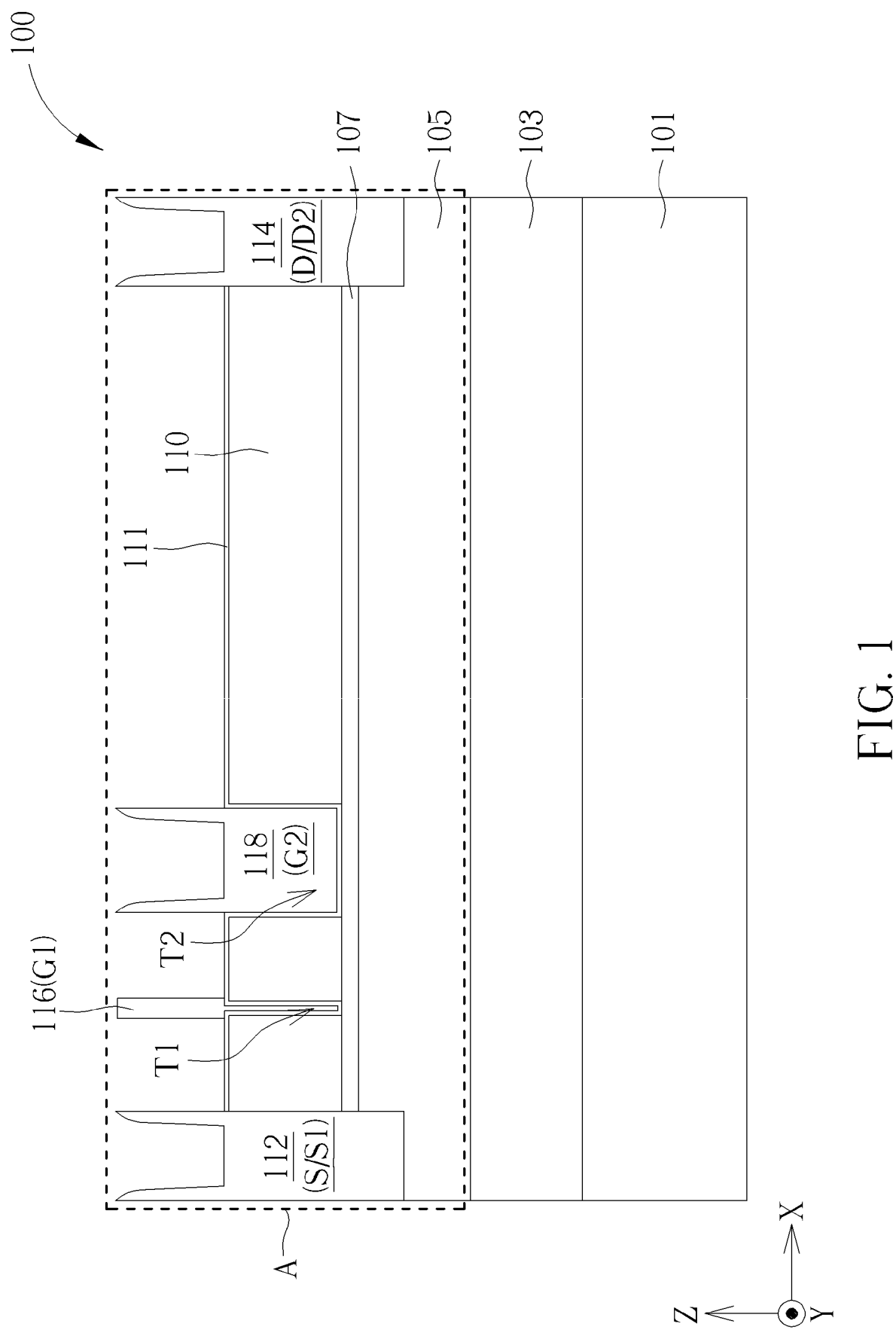
FIG. 1 is a schematic cross-sectional view of a semiconductor device according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "under," "lower," "over," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as "below" and/or "beneath" other elements or features would then be oriented "above" and/or "over" the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as "first," "second," and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term "about" or "substantial" generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term "about" or "substantial". Accordingly, unless indicated to the contrary, the numerical parameters set forth in the present disclosure and attached claims are approximations that can vary as desired.

Furthermore, as disclosed herein, the terms "coupled to" and "electrically connected to" include any directly and indirectly electrical connecting means. Therefore, if it is described in this document that a first component is coupled or electrically connected to a second component, it means that the first component may be directly connected to the second component, or may be indirectly connected to the second component through other components or other connecting means.

In the present disclosure, a "compound semiconductor" refers to a group III-V compound semiconductor that includes at least one group III element and at least one group V element, where group III element may be boron (B), aluminum (Al), gallium (Ga) or indium (In), and group V element may be nitrogen (N), phosphorous (P), arsenic (As), or antimony (Sb). Furthermore, the group III-V semiconductor may refer to, but not limited to, gallium nitride (GaN), indium phosphide (InP), aluminum arsenide (AlAs), gallium arsenide (GaAs), aluminum gallium nitride (AlGaN), indium aluminum gallium nitride (InAlGaN), indium gallium nitride (InGaN), aluminum nitride (AlN), gallium indium phosphide (GaInP), AlGaAs, InAlAs, InGaAs, or the like, or the combination thereof. Besides, based on different requirements, compound semiconductor may contain dopants to become semiconductor with specific conductivity type, such as n-type or p-type.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

The present disclosure is directed to a semiconductor device that integrates a normally-off high electron mobility transistor (HEMT) and a normally-on HEMT, and includes a first gate electrode and a second gate electrode with different lengths disposed in a passivation layer having compressive stress. The stresses of the passivation layer applying to the first gate electrode and the second gate electrode are different from each other, thereby adjusting the threshold voltage of the normally-off HEMT and the threshold voltage of the normally-on HEMT in the semiconductor device.

FIG. 1 is a schematic cross-sectional view of a semiconductor device 100 according to an embodiment of the present disclosure. The semiconductor device 100 includes a substrate 101. In some embodiments, the material of the substrate 101 may include ceramic, silicon carbide (SiC), aluminum nitride (AlN), sapphire or silicon. When the substrate 101 is made of a material with high hardness, high thermal conductivity and low electrical conductivity, such as a ceramic substrate, it is more suitable for high-voltage semiconductor devices. The aforementioned high hardness, high thermal conductivity and low electrical conductivity are compared with a single-crystal silicon substrate, and the high-voltage semiconductor devices refer to semiconductor devices with an operating voltage higher than 50V. In some embodiments, the substrate 101 may be a semiconductor-on-insulator (SOI) substrate. In some other embodiments, the substrate 101 may be provided by a composite substrate (or referred to as a QST substrate) composed of a core substrate wrapped around by a composite material layer. The composition of the core substrate includes ceramic, silicon carbide, aluminum nitride, sapphire or silicon. The composite material layer includes an insulating material layer and a semiconductor material layer. The insulating material layer may be single or multiple layers of silicon oxide, silicon nitride or silicon oxynitride. The semiconductor material layer may be silicon or polysilicon. Moreover, during the fabrication of the semiconductor devices, the composite material layer on the backside of the core substrate may be removed by a thinning process, such as a grinding or an etching process, so that the backside of the core substrate is exposed.

The semiconductor device 100 also includes a buffer layer 103, a semiconductor channel layer 105, and a semiconductor barrier layer 107 stacked on the substrate 101 in sequence from bottom to top. The buffer layer 103 may be used to reduce the degree of stress or lattice mismatch between the substrate 101 and the semiconductor channel layer 105. In some embodiments, a nucleation layer may be disposed between the buffer layer 103 and the substrate 101. A high resistance layer (or referred to as an electrical isolation layer) may be disposed between the buffer layer 103 and the semiconductor channel layer 105. The material of the nucleation layer, the buffer layer 103, the high resistance layer, the semiconductor channel layer 105 and the semiconductor barrier layer 107 includes compound semiconductors. In some embodiments, the nucleation layer is, for example, an aluminum nitride (AlN) layer. The buffer layer 103 may be a superlattice (SL) structure, for example, including a plurality of alternately stacked aluminum gallium nitride (AlGaN) layers and aluminum nitride (AlN) layers. The high resistance layer is, for example, a carbon-doped gallium nitride (C—GaN) layer. In some embodiments, the semiconductor channel layer 105 is, for example, an undoped gallium nitride (u-GaN) layer. The semiconductor barrier layer 107 is a compound semiconductor layer with an energy gap greater than that of the semiconductor channel layer 105, for example, an aluminum gallium nitride (AlGaN) layer. The materials of the aforementioned compound semiconductor layers are for example, but not limited thereto. The compositions and structural arrangements of the aforementioned compound semiconductor layers of the semiconductor device 100 may be determined according to the requirements of various electronic components.

Still referring to FIG. 1, the semiconductor device 100 includes a source electrode 112 and a drain electrode 114 disposed on the semiconductor channel layer 105. In some embodiments, the source electrode 112 and the drain electrode 114 may be extended downward to pass through the semiconductor barrier layer 107 and into the semiconductor channel layer 105. In other embodiments, the source electrode 112 and the drain electrode 114 may pass through the semiconductor barrier layer 107 to be disposed on the top surface of the semiconductor channel layer 105. In some other embodiments, the source electrode 112 and the drain electrode 114 may be disposed on the top surface of the semiconductor barrier layer 107. According to some embodiments of the present disclosure, the semiconductor device 100 further includes a passivation layer 110 covering the semiconductor barrier layer 107 and disposed between the source electrode 112 and the drain electrode 114. The composition of the passivation layer 110 is, for example, silicon nitride or other dielectric materials with compressive stress. In some embodiments, the compressive stress of the passivation layer 110 is, for example, about −2.0 GPa or higher than 2.0 GPa. The compressive stress of the passivation layer 110 may be adjusted by the parameters of the deposition process for forming the passivation layer 110. For example, the compressive stress of the passivation layer 110 may be adjusted by the AC frequency of the plasma used in a plasma enhanced chemical vapor deposition (PECVD) process for forming the passivation layer 110. The passivation layer 110 with compressive stress (stress value<0) is formed by reducing the AC frequency of the plasma used in the PECVD process, but not limited thereto.

In addition, the semiconductor device 100 includes a first gate electrode 116 and a second gate electrode 118 that are laterally separated from each other. The first gate electrode 116 fills up a first trench T1 in the passivation layer 110. The second gate electrode 118 fills up a second trench T2 in the passivation layer 110. Moreover, along a first direction (for example, the X-axis direction), a first gate length of the first gate electrode 116 is smaller than a second gate length of the second gate electrode 118. In some embodiments, the first gate length may be in a range of about 0.1 micrometers (μm) to about 2.0 μm. The second gate length may be in a range of greater than 2.0 μm to about 5.0 μm. When the first gate length is short enough, for example, between about 0.1 μm and about 2.0 μm, the passivation layer 110 has the effect of compressive stress on the first gate electrode 116, thereby generating an inner electric field between the semiconductor barrier layer 107 and the semiconductor channel layer 105 to form a depletion region. Accordingly, the threshold voltage determined by the first gate electrode 116 is greater than 0 to realize the function of a normally-off transistor. Moreover, according to some embodiments of the present disclosure, the semiconductor barrier layer 107 has a flat top surface. The first gate electrode 116 and the second gate electrode 118 are disposed on the flat top surface of the semiconductor barrier layer 107. There is no need to etch the semiconductor barrier layer 107 and the semiconductor channel layer 105 for forming a recess used in the conventional normally-off HEMT. In the semiconductor devices of the present disclosure, the function of the normally-off transistor is achieved by the first gate electrode 116 without a recess in the semiconductor layers. Accordingly, the semiconductor devices of the present disclosure will not have the problem of damages in the semiconductor layers produced by an etching process for forming a recess. Therefore, the reliability of the semiconductor devices of the present disclosure is improved. Furthermore, when the compressive stress of the passivation layer 110 is increased by the process parameters or the material development, the first gate length of the first gate electrode 116 may be increased to avoid the first gate electrode 116 from being punched through, and the threshold voltage determined by the first gate electrode 116 still is greater than zero. In addition, when the second gate length is long enough, for example, between greater than about 2.0 μm and about 5.0 μm, the passivation layer 110 will not have the effect of compressive stress on the second gate electrode 118, and a depletion region will not be generated between the semiconductor barrier layer 107 and the semiconductor channel layer 105. Accordingly, the threshold voltage determined by the second gate electrode 118 is less than 0 to realize the function of the normally-on transistor. Moreover, the second gate electrode 118 with a long length is not easy to be punched through, thereby withstanding high voltages.

In addition, the semiconductor device 100 includes a gate dielectric layer 111 conformally formed on the sidewalls and the bottom surfaces of the first trench T1 and the second trench T2, and on the top surface of the passivation layer 110. The gate dielectric layer 111 is disposed between the first gate electrode 116 and the semiconductor barrier layer 107, and between the second gate electrode 118 and the semiconductor barrier layer 107. In some embodiments, the composition of the gate dielectric layer 111 is, for example, silicon oxide (SiOx), silicon nitride ($Si_3N_4$), yttrium oxide ($Y_2O_3$), yttrium titanium oxide ($Y_2TiO_5$), ytterbium oxide ($Yb_2O_3$), hafnium oxide ($HfO_2$), zirconium oxide ($ZrO_2$), titanium oxide ($TiO_2$), aluminum oxide ($Al_2O_3$), tantalum oxide ($Ta_2O_5$), other dielectric materials or a combination thereof. In some embodiments, the compositions of the first gate electrode 116 and the second gate electrode 118 are metal. The composition of the gate dielectric layer 111 is an insulating material. The compositions of the semiconductor barrier layer 107 and the semiconductor channel layer 105 are semiconductor materials. Therefore, a metal-insulator-semiconductor (MIS) structure is formed in the semiconductor device 100.

According to some embodiments of the present disclosure, the passivation layer 110 applies a compressive stress to the first gate electrode 116 having a shorter gate length, so that the threshold voltage determined by the first gate electrode 116 is greater than 0 ($V_{th}>0$) to realize the function of a normally-off HEMT. The second gate electrode 118 having a longer gate length in the passivation layer 110 is not affected by compressive stress, so that the threshold voltage determined by the second gate electrode 118 is less than 0 ($V_{th}<0$) to realize the function of a normally-on HEMT. Accordingly, the semiconductor device 100 of the present disclosure integrates the functions of the normally-off HEMT and the normally-on HEMT. The first gate electrode 116 constitutes the gate of a normally-off transistor. The threshold voltage of the semiconductor device 100 is controlled by the first gate electrode 116 to realize the function of the normally-off HEMT in the semiconductor device 100. Therefore, the first gate electrode 116 may be referred to as a control gate. The second gate electrode 118 constitutes the gate of a normally-on transistor. The second gate electrode 118 blocks a higher drain bias voltage to achieve the effect of withstanding high voltages in the semiconductor device 100. Therefore, the second gate electrode 118 may be referred to as a blocking gate.

In addition, according to some embodiments of the present disclosure, the first gate electrode 116 and the second gate electrode 118 are electrically isolated from each other, and the second gate electrode 118 is electrically connected to the source electrode 112. In one embodiment, the second gate electrode 118 and the source electrode 112 may be electrically coupled to a ground terminal, thereby reducing the gate-drain capacitance (Cgd) and further reducing the switching loss of the semiconductor device 100. Moreover, the first gate electrode 116 with a shorter gate length can reduce the gate-drain coupling area, thereby reducing the parasitic gate-drain capacitance (parasitic Cgd) of the semiconductor device 100. Moreover, in the semiconductor device 100, there is no need to etch the semiconductor barrier layer 107 and the semiconductor channel layer 105 for forming a recess, the function of a normally-off device is achieved by the first gate electrode 116 with a shorter gate length and the passivation layer 110 with compressive stress. Therefore, the semiconductor device 100 of the present disclosure can avoid damaging the semiconductor barrier layer 107 and the semiconductor channel layer 105. Accordingly, the reliability of the semiconductor devices of the present disclosure is improved. Furthermore, the semiconductor devices of the present disclosure can avoid reducing the on-resistance (Ron), thereby reducing the conduction loss of the semiconductor devices.

Figure 2:
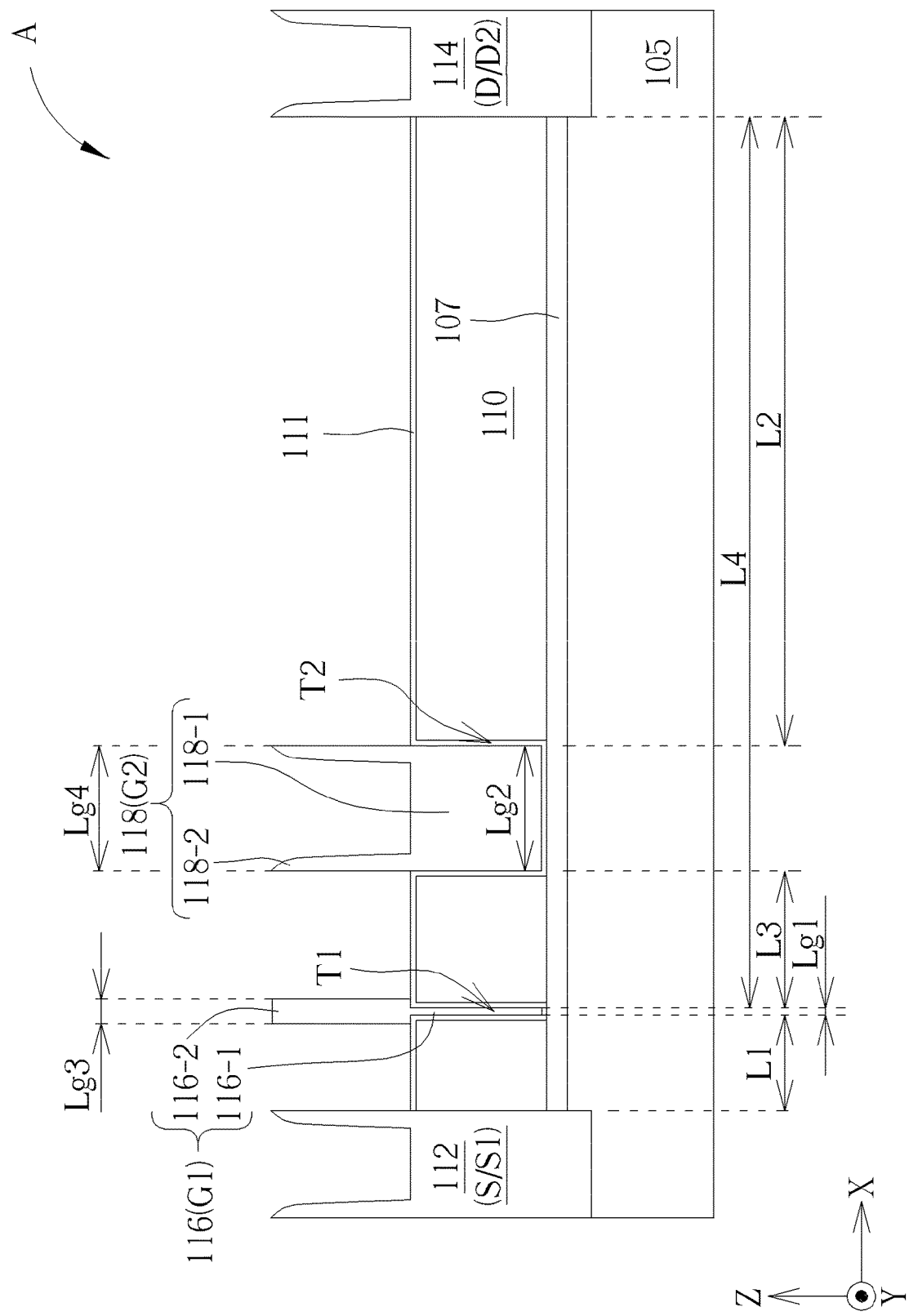
FIG. 2 is an enlarged schematic cross-sectional view of the area A in FIG. 1 according to an embodiment of the present disclosure, where the relative dimensions of some features of a semiconductor device are indicated.

FIG. 2 is an enlarged schematic cross-sectional view of the area A in FIG. 1 according to an embodiment of the present disclosure, where the relative dimensions of some features of the semiconductor device 100 are indicated. As shown in FIG. 2, in one embodiment, the first gate electrode 116 includes a first portion 116-1 located in the passivation layer 110 and a second portion 116-2 located above the passivation layer 110. The second gate electrode 118 includes a third portion 118-1 located in the passivation layer 110 and a fourth portion 118-2 located above the passivation layer 110. The first portion 116-1 and the third portion 118-1 are laterally separated from each other. The second portion 116-2 and the fourth portion 118-2 are also laterally separated from each other. Moreover, along the first direction (for example, the X-axis direction), the first portion 116-1 of the first gate electrode 116 has a first gate length Lg1. The third portion 118-1 of the second gate electrode 118 has a second gate length Lg2. The second portion 116-2 of the first gate electrode 116 has a third gate length Lg3. The fourth portion 118-2 of the second gate electrode 118 has a fourth gate length Lg4. The fourth portion 118-2 of the second gate electrode 118 has a recess due to the conductive material of the second gate electrode 118 is conformally deposited in the second trench T2 of the passivation layer 110. In addition, the overall length of the fourth portion 118-2 of the second gate electrode 118 is determined by the fourth gate length Lg4. According to some embodiments of the present disclosure, the first gate length Lg1 is smaller than the second gate length Lg2, and the third gate length Lg3 is smaller than the fourth gate length Lg4. In one embodiment, the first gate length Lg1 is greater than 0 µm and less than 1 µm. The second gate length Lg2 is greater than 1 µm and less than or equal to 3 µm. In some embodiments, the first gate length Lg1 is, for example, 0.1 µm, 0.5 µm, or 0.8 µm, and the second gate length Lg2 is, for example, 1.5 µm, 2.0 µm, or 3.0 µm.

In addition, along the first direction (for example, the X-axis direction), there is a first distance L1 between the first gate electrode 116 and the source electrode 112. There is a second distance L2 between the second gate electrode 118 and the drain electrode 114. The first distance L1 is smaller than the second distance L2. The first distance L1 is, for example, from about 2 µm to about 4 µm. Moreover, there is a third distance L3 between the first gate electrode 116 and the second gate electrode 118. The third distance L3 is, for example, from about 2 µm to about 4 µm. The first distance L1 and the third distance L3 may both be in a range of 2 µm to 4 µm. The first distance L1 may be greater than, less than or equal to the third distance L3. When the third distance L3 and the first distance L1 both are less than 2 µm, the passivation layer 110 may not apply compressive stress to the first gate electrode 116. When the third distance L3 and the first distance L1 both are greater than 4 µm, the size of the semiconductor device is increased. In addition, there is a fourth distance L4 between the first gate electrode 116 and the drain electrode 114. The second distance L2 between the second gate electrode 118 and the drain electrode 114 is smaller than the fourth distance L4. Compared with the first gate electrode 116 (a control gate), the second gate electrode 118 (a blocking gate) is closer to the drain electrode 114. The first gate electrode 116 is located between the source electrode 112 and the second gate electrode 118. The second gate electrode 118 is located between the first gate electrode 116 and the drain electrode 114.

Furthermore, in one embodiment, the compositions of the first gate electrode 116 and the second gate electrode 118 are different from each other. The composition of the first gate electrode 116 is, for example, metal, polysilicon or silicide. The metal is, for example, nickel (Ni), gold (Au), platinum (Pt), tungsten (W), titanium (Ti), aluminum (Al), molybdenum (Mo) or a multilayered stack of the aforementioned metal layers. The silicide is, for example, the silicide of the aforementioned metals. The composition of the second gate electrode 118 is, for example, titanium (Ti), aluminum (Al), nickel (Ni), molybdenum (Mo), gold (Au) or a multilayered stack of the aforementioned metal layers. In some embodiments, the source electrode 112, the drain electrode 114 and the second gate electrode 118 may have the same composition, for example, titanium (Ti), aluminum (Al), nickel (Ni), molybdenum (Mo), gold (Au) or a multilayered stack of the aforementioned metal layers. In another embodiment, the first gate electrode 116 and the second gate electrode 118 may have the same composition, for example, titanium (Ti), aluminum (Al), nickel (Ni), molybdenum (Mo), gold (Au) or a multilayered stack of the aforementioned metal layers.

Figure 3:
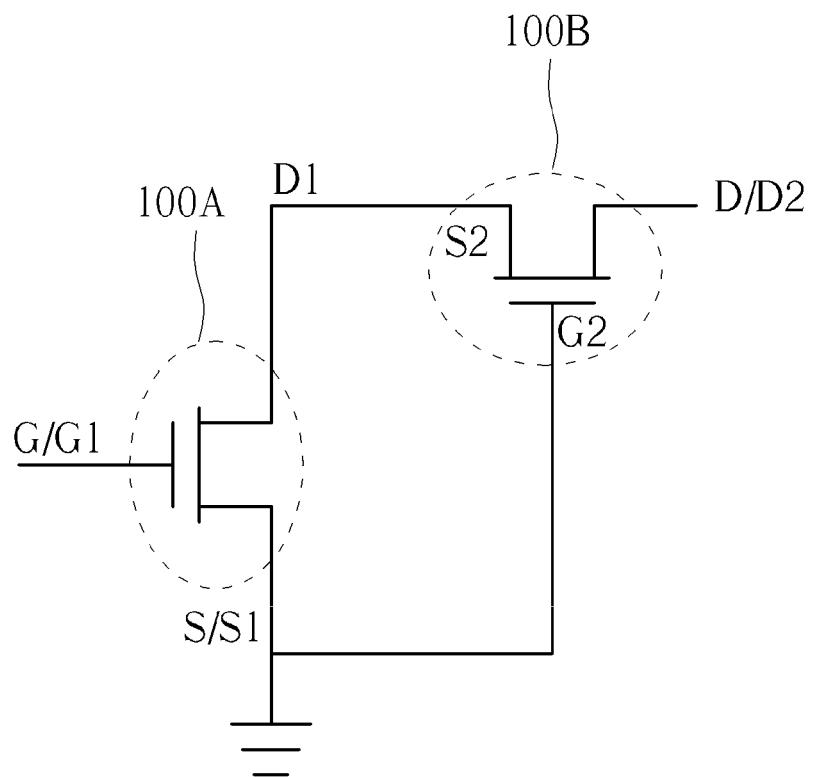
FIG. 3 is an equivalent circuit diagram of a semiconductor device according to an embodiment of the present disclosure.

FIG. 3 is an equivalent circuit diagram of a semiconductor device 100 according to an embodiment of the present disclosure. As shown in FIG. 3, the semiconductor device 100 includes a normally-off transistor (HEMT) 100A and a normally-on transistor (HEMT) 100B to construct a cascode normally-off semiconductor device. In one embodiment, the first gate electrode 116 of FIG. 1 constitutes the gate G1 of the normally-off transistor 100A. The second gate electrode 118 of FIG. 1 constitutes the gate G2 of the normally-on transistor 100B. The drain D1 of the normally-off transistor 100A is electrically connected to the source S2 of the normally-on transistor 100B. The semiconductor channel layer 107 of FIG. 1 is equivalent to the electrical connection between the drain D1 and the source S2, so that the drain D1 and the source S2 are not shown in FIG. 1. The gate G2 of the normally-on transistor 100B is electrically connected to the source S1 of the normally-off transistor 100A. In addition, the source S1 of the normally-off transistor 100A is electrically coupled to a ground terminal, so that the gate G2 of the normally-on transistor 100B is also electrically coupled to the ground terminal. As shown in FIG. 3, the equivalent circuit of the semiconductor device 100 has three terminals of the gate G, the source S and the drain D. The gate G is provided by the gate G1 of the normally-off transistor 100A. The source S is provided by the source S1 of the normally-off transistor 100A. The drain D is provided by the drain D2 of the normally-on transistor 100B. According to one embodiment of the present disclosure, the gate G1 of the normally-off transistor 100A may be used as a control gate to determine the threshold voltage ($V_{th}$) of the semiconductor device 100. The gate G2 of the normally-on transistor 100B may be used as a blocking gate to enhance the breakdown voltage of the semiconductor device 100. In some embodiments, the semiconductor device 100 may withstand a high voltage of 600 volts (V) or above 600V.

Figure 4:
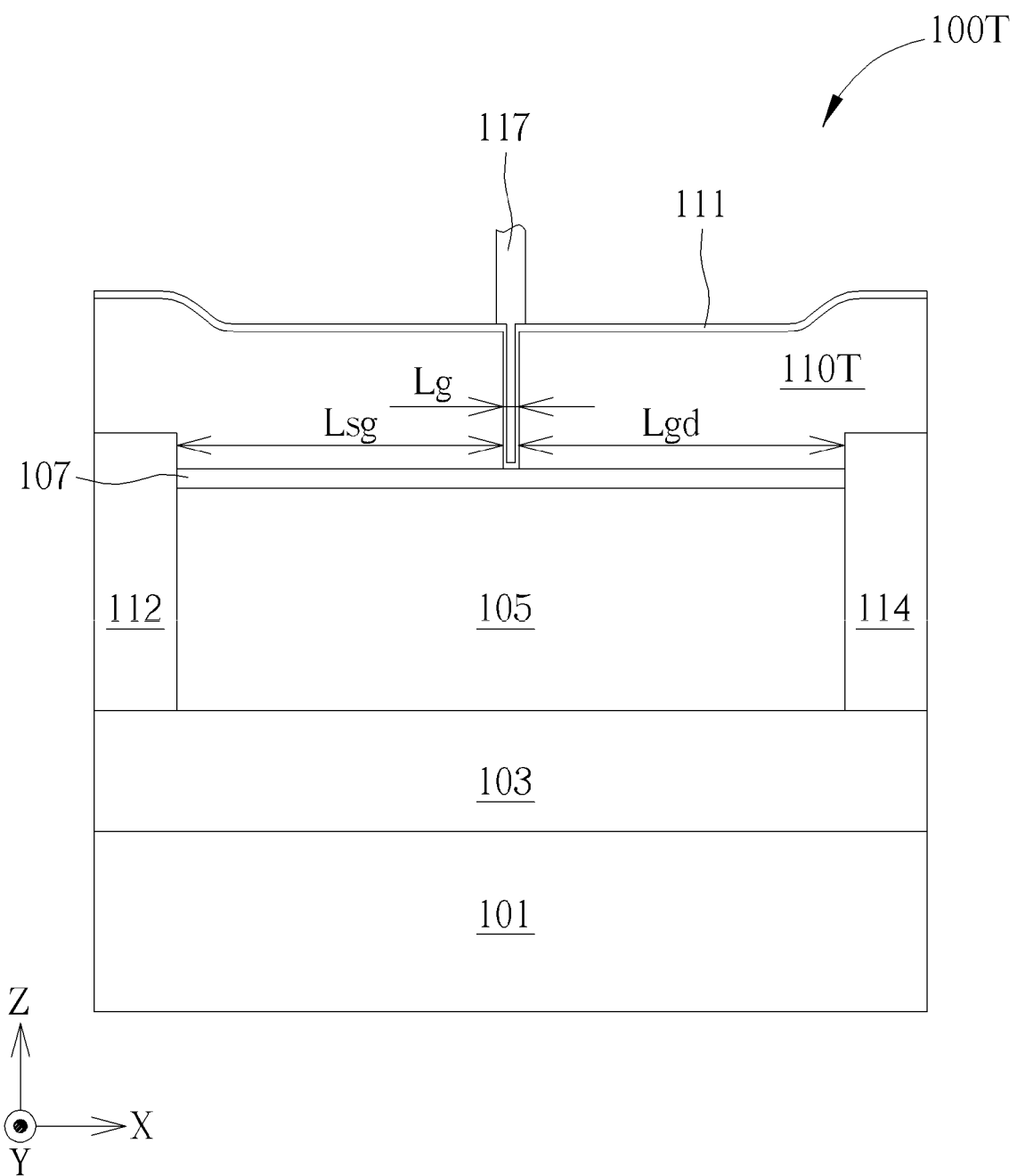
FIG. 4 is a schematic cross-sectional view of a high electron mobility transistor (HEMT) according to a comparative embodiment of the present disclosure.

FIG. 4 is a schematic cross-sectional view of a high electron mobility transistor (HEMT) 100T according to a comparative embodiment of the present disclosure. The HEMT 100T includes a substrate 101, and a buffer layer 103, a semiconductor channel layer 105 and a semiconductor barrier layer 107 stacked on the substrate 101 in sequence from bottom to top. A source electrode 112 and a drain electrode 114 are disposed to pass through the semiconductor barrier layer 107 and in the semiconductor channel layer 105. A passivation layer 110T is disposed to cover the semiconductor barrier layer 107, the source electrode 112 and the drain electrode 114. One gate electrode 117 is disposed in the passivation layer 110T. Along a first direction (for example, the X-axis direction), the gate electrode 117 in the passivation layer 110T has a gate length Lg. There is a source-gate distance Lsg between the source electrode 112 and the gate electrode 117. There is a gate-drain distance Lgd between the gate electrode 117 and the drain electrode 114. A gate dielectric layer 111 is conformally formed in the trench of the passivation layer 110T and on the top surface of the passivation layer 110T. The gate dielectric layer 111 is located between the gate electrode 117 and the semiconductor barrier layer 107. The HEMT 100T of FIG. 4 is used to illustrate the effects of different gate lengths Lg in the passivation layer 110T with and without compressive stress. The HEMT 100T of FIG. 4 is also used to illustrate the electrical performances of different gate lengths Lg in the passivation layer 110T with compressive stress.

Figure 5:
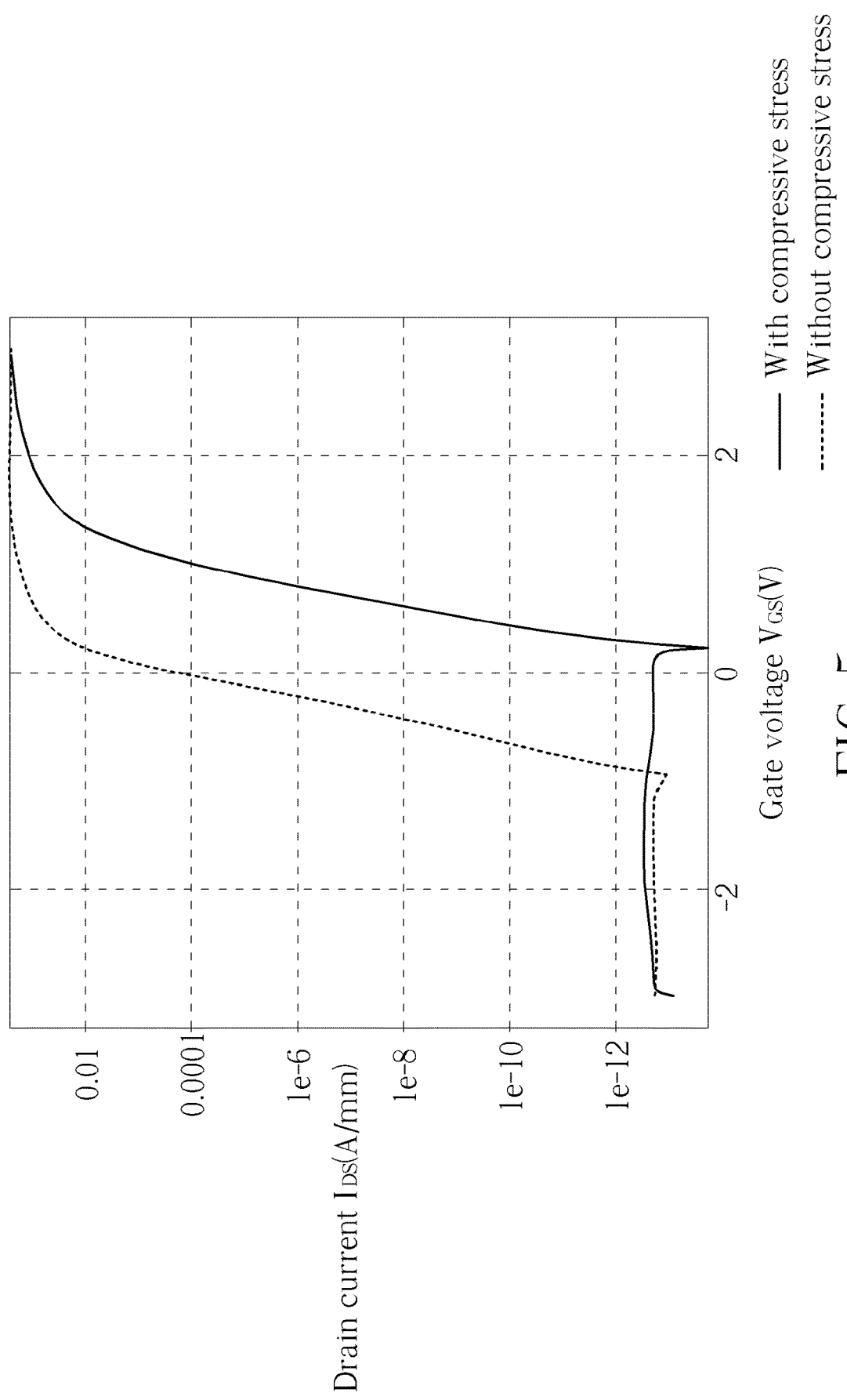
FIG. 5 is a graph showing the drain current versus the gate voltage of HEMTs according to some embodiments of the present disclosure.

FIG. 5 is a graph showing the drain current $I_{DS}$ versus the gate voltage $V_{GS}$ of HEMTs 100T according to some embodiments of the present disclosure, where the passivation layers 110T of the HEMTs 100T are formed with a compressive stress (for example, the compressive stress is equal to −2 GPa) and without a compressive stress (for example, the compressive stress is equal to 0 GPa), respectively. In addition, the gate length Lg is 0.1 μm, the source-gate distance Lsg is 2.0 μm, and the gate-drain distance Lgd is 2.0 μm. As shown in FIG. 5, while the gate length Lg is 0.1 μm, and the gate electrode is disposed in the passivation layer 110T without a compressive stress, it would be known that the gate voltage $V_{GS}$ is less than 0 corresponding to the drain current $I_{DS}$ equal to 1e−7 amps/mm (A/mm). Accordingly, the threshold voltage ($V_{th}$) of the HEMT 100T is less than 0. While the gate length Lg is 0.1 μm, and the gate electrode is disposed in the passivation layer 110T with a compressive stress, it would be known that the gate voltage $V_{GS}$ is greater than 0 corresponding to the drain current $I_{DS}$ equal to 1e−7 A/mm. Accordingly, the threshold voltage ($V_{th}$) of the HEMT 100T is greater than 0. It would be known from FIG. 5 that while the gate length Lg is 0.1 μm, compared with the gate electrode disposed in the passivation layer 110T without a compressive stress, the passivation layer 110T with a compressive stress can apply the compressive stress to the gate electrode 117 having the gate length Lg of 0.1 μm, thereby changing the threshold voltage ($V_{th}$) of the HEMT 100T from less than 0 to be greater than 0.

Figure 6:
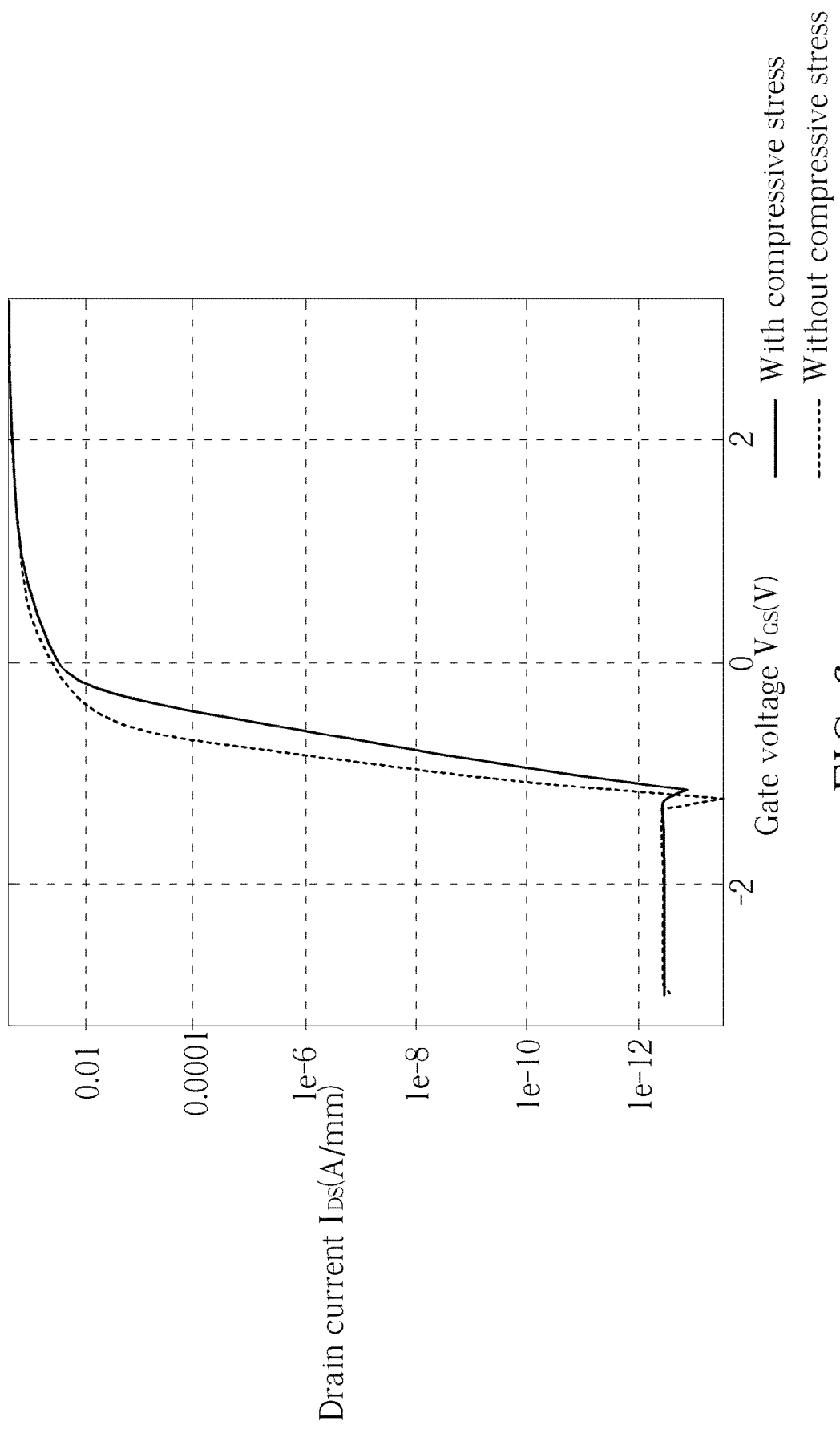
FIG. 6 is a graph showing the drain current versus the gate voltage of HEMTs according to some other embodiments of the present disclosure.

FIG. 6 is a graph showing the drain current $I_{DS}$ versus the gate voltage $V_{GS}$ of HEMTs 100T according to some embodiments of the present disclosure, where the passivation layers 110T of the HEMTs 100T are formed with a compressive stress and without a compressive stress, respectively, and the gate length is in a range of about 1 μm to about 3 μm (for example, 3.0 μm). As shown in FIG. 6, whether the gate electrode 117 is disposed in the passivation layer 110T with a compressive stress or without a compressive stress, it would be known that the gate voltages $V_{GS}$ of the HEMTs 100T are all less than 0 corresponding to the drain current $I_{DS}$ equal to 1e−7 A/mm. Accordingly, the threshold voltages ($V_{th}$) of the HEMTs 100T are all less than 0. It would be known from FIG. 6 that while the gate length Lg is 3.0 μm, the passivation layer 110T with a compressive stress and without a compressive stress both cannot produce the effect of compressive stress on the gate electrode 117. Accordingly, the threshold voltages ($V_{th}$) of the HEMTs 100T are not changed from less than 0 to be greater than 0.

Figure 7:
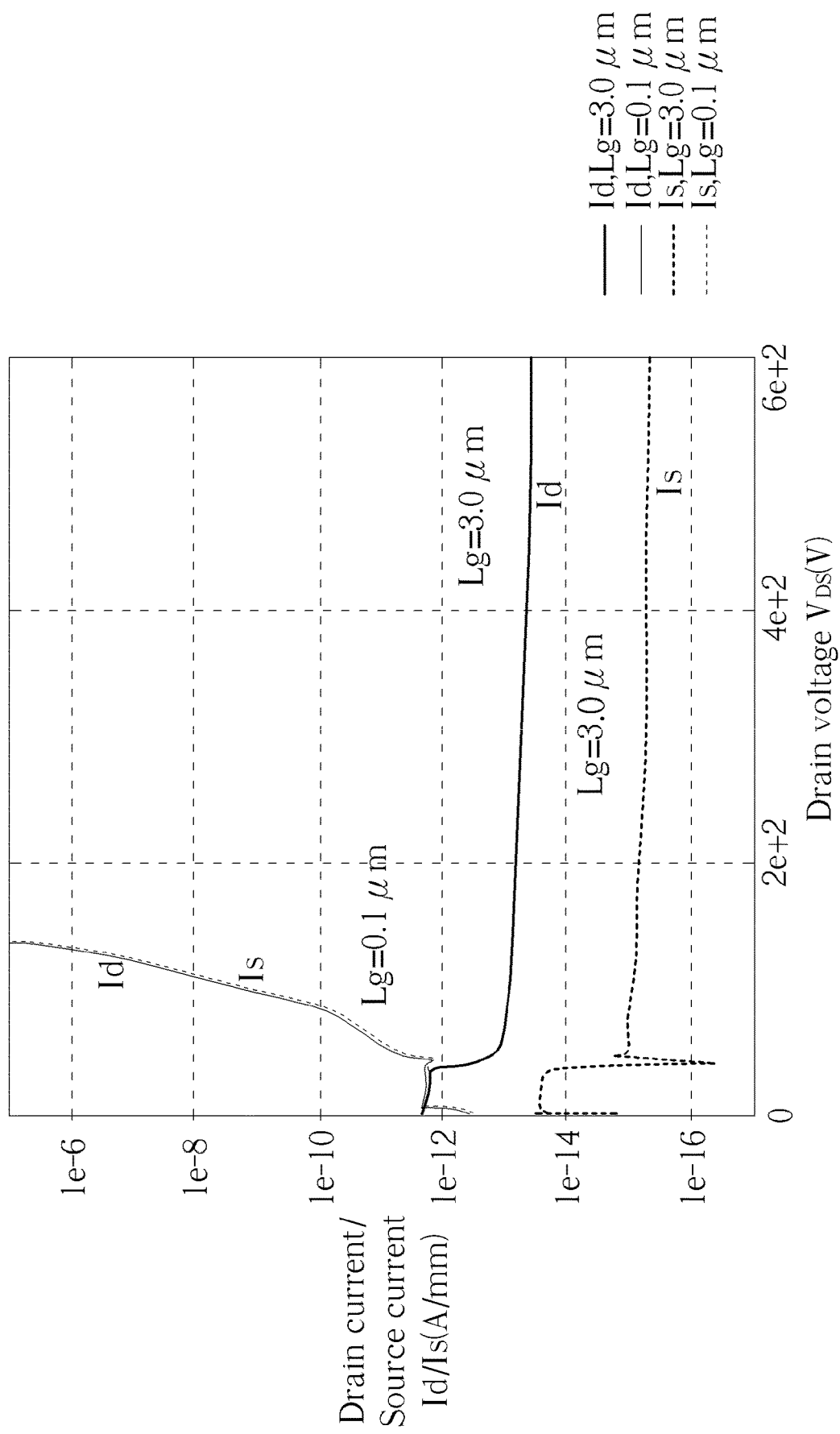
FIG. 7 is a graph showing the drain current and the source current versus the drain voltage of a HEMT according to a comparative embodiment of the present disclosure.

FIG. 7 is a graph showing the drain current Id and the source current Is versus the drain voltage $V_{DS}$ of a HEMT 100T according to a comparative embodiment of the present disclosure, where the gate lengths Lg are, for example 0.1 μm and 3.0 μm, respectively, and the passivation layer 110T has a compressive stress. In this embodiment, the applied gate voltage Vg is −6V, so that the HEMT 100T of the comparative embodiment is in an off state. As shown in FIG. 7, while the gate length Lg is less than 1 μm, the drain current Id and the source current Is are increased sharply at the drain voltage $V_{DS}$ of 100V. It would be known that the gate length Lg less than 1 μm (for example, 0.1 μm) cannot withstand voltages above 100V. While the gate length Lg is greater than 1 μm (for example, 3.0 μm), the drain current Id and source current Is both are maintained at a stable low current at the drain voltage $V_{DS}$ of 600V. It would be known that the gate length Lg of 3.0 μm can withstand high voltage of 600V or above 600V.

From FIG. 5 and FIG. 6, it would be known that the passivation layer with a compressive stress can apply the compressive stress to the gate electrode with a short gate length, such as in a range of about 0.1 μm to about 1.0 μm, thereby making the HEMT to be a normally-off transistor with a threshold voltage ($V_{th}$) greater than 0. Moreover, the passivation layer with a compressive stress cannot apply the compressive stress to the gate electrode with a long gate length, such as greater than 1.0 μm, thereby making the HEMT to be a normally-on transistor with a threshold voltage ($V_{th}$) less than 0. In addition, it would be known from FIG. 7 that the gate electrode with a shorter gate length of about 0.1 μm can realize the function of a normally-off transistor. The gate electrode with a longer gate length of about 3.0 μm can realize the function of a normally-on transistor, and can withstand higher voltages, such as 600V or above 600V.

Figure 8:
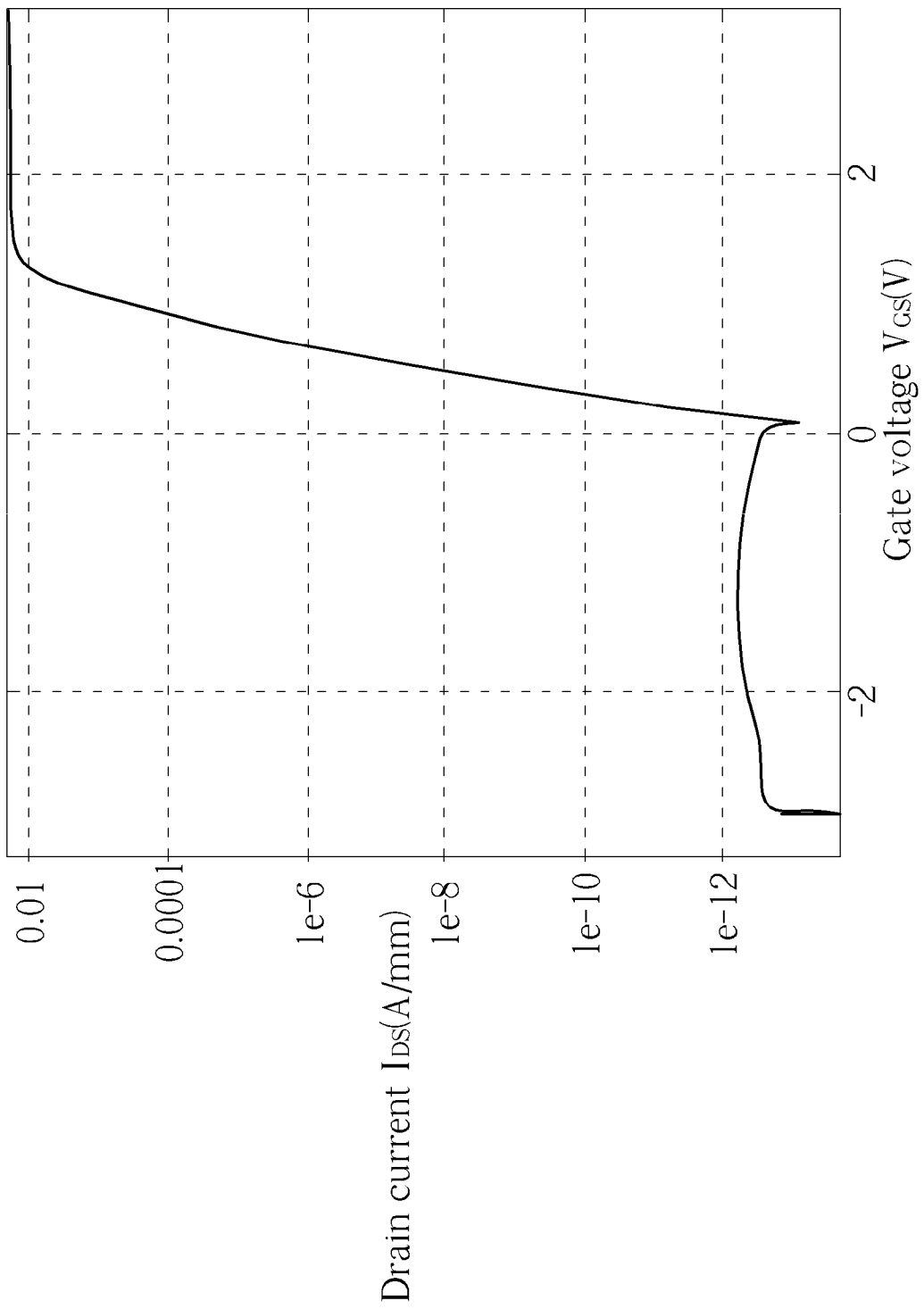
FIG. 8 is a graph showing the drain current versus the gate voltage of a semiconductor device according to an embodiment of the present disclosure.

FIG. 8 is a graph showing the drain current $I_{DS}$ versus the gate voltage $V_{GS}$ of a semiconductor device 100 according to an embodiment of the present disclosure. Referring to FIG. 1 and FIG. 8, the semiconductor device 100 includes the first gate electrode 116 and the second gate electrode 118 disposed in the passivation layer 110 with compressive stress. In one embodiment, the first gate length of the first gate electrode 116 is 0.1 μm, and the second gate length of the second gate electrode 118 is 3.0 μm. The gate voltage $V_{GS}$ is applied to the first gate electrode 116. The second gate electrode 118 is electrically connected to the source electrode 112 and further electrically coupled to a ground terminal. It would be known from FIG. 8 that when the gate voltage $V_{GS}$ applied to the first gate electrode 116 is a negative bias voltage or 0V, the drain current $I_{DS}$ is very low, such as about 1e−12 A/mm. When the gate voltage $V_{GS}$ applied to the first gate electrode 116 is a positive bias voltage, the drain current $I_{DS}$ is increased sharply, such as from about 1e−12 A/mm to about 1e−4 A/mm by applying 1V. As shown in FIG. 8, the first gate electrode 116 of the semiconductor device 100 can realize the operation of a normally-off transistor.

Figure 9:
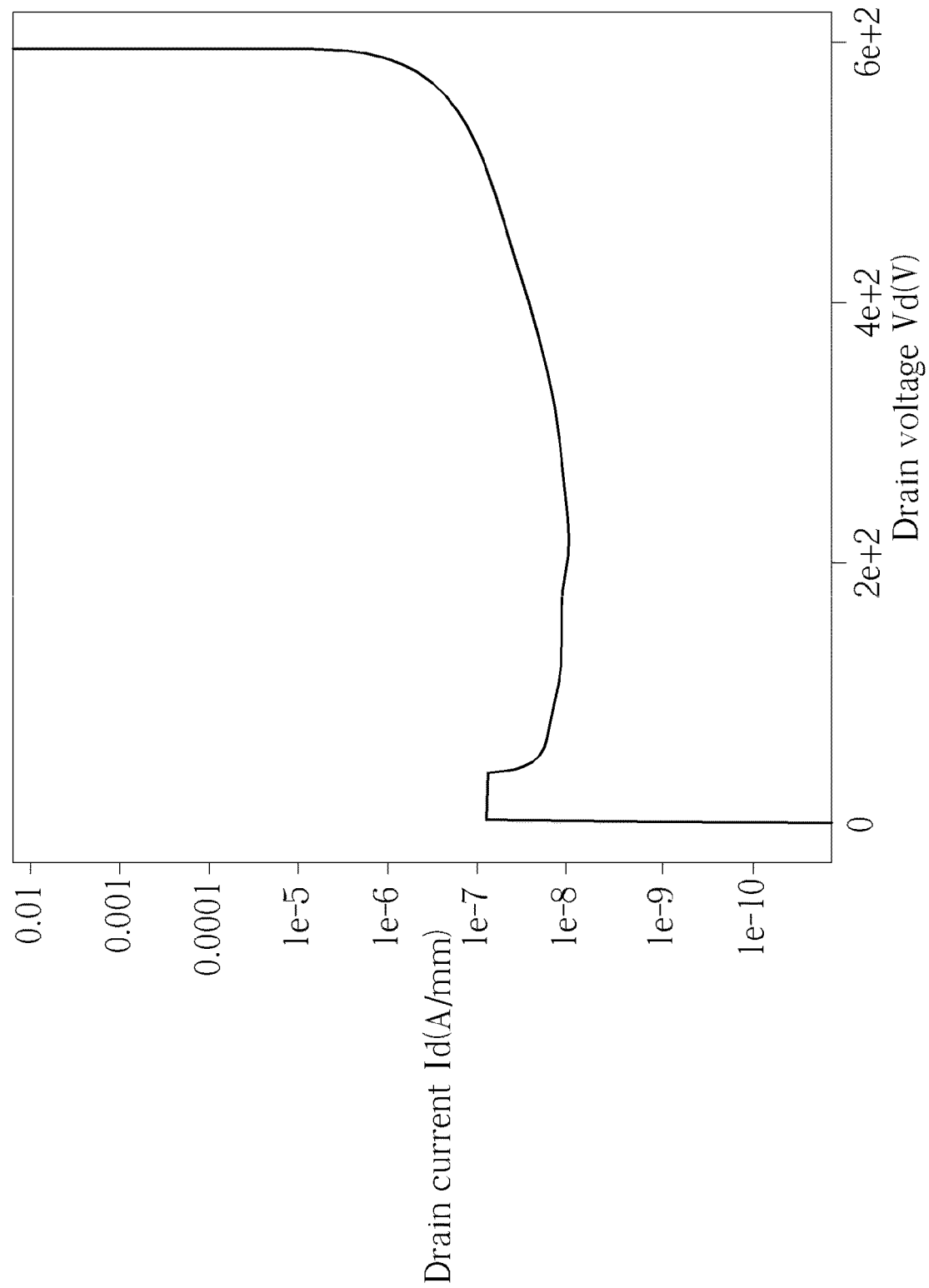
FIG. 9 is a graph showing the drain current versus the drain voltage of a semiconductor device according to an embodiment of the present disclosure.

FIG. 9 is a graph showing the drain current Id versus the drain voltage Vd of a semiconductor device 100 according to an embodiment of the present disclosure. Referring to FIG. 1 and FIG. 9, the semiconductor device 100 includes the first gate electrode 116 and the second gate electrode 118 disposed in the passivation layer 110 with compressive stress. In one embodiment, the first gate length of the first gate electrode 116 is 0.1 μm, and the second gate length of the second gate electrode 118 is 3.0 μm. The gate voltage Vg of −6V is applied to the first gate electrode 116. The second gate electrode 118 is electrically connected to the source electrode 112 and further electrically coupled to a ground terminal. It would be known from FIG. 9 that when the drain voltage Vd is in the range of greater than 0V to less than 600V, the drain current Id is maintained in a range of about 1e−8 A/mm to about 1e−7 A/mm. When the drain voltage Vd is greater than 600V, the drain current Id is increased sharply to 0.01 A/mm. As shown in FIG. 9, the second gate electrode 118 of the semiconductor device 100 has the ability of blocking high voltages. For example, when the second gate length is 3.0 μm, a breakdown voltage of 600V is obtained in the semiconductor device 100. Therefore, the breakdown voltage of the semiconductor device 100 is enhanced by the second gate electrode 118 for high voltage applications.

According to some embodiments of the present disclosure, a semiconductor device integrating a normally-off HEMT and a normally-on HEMT is provided and includes a first gate electrode and a second gate electrode with different lengths disposed in a passivation layer. The threshold voltage of the normally-off HEMT and the threshold voltage of the normally-on HEMT in the semiconductor device are adjusted by the stress values of the passivation layer applying to the first gate electrode and the second gate electrode being different from each other.

Furthermore, according to some embodiments of the present disclosure, the passivation layer applies a compressive stress to the first gate electrode, so that the threshold voltage determined by the first gate electrode is greater than 0 ($V_{th}$>0) to realize the function of a normally-off transistor, and the switching speed of the semiconductor device is also improved. In addition, there is no compressive stress applied to the second gate electrode by the passivation layer, so that the threshold voltage determined by the second gate electrode is less than 0 ($V_{th}$<0) to realize the function of a normally-on transistor, and the breakdown voltage of the semiconductor device is also increased.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a semiconductor channel layer and a semiconductor barrier layer, disposed on a substrate;
   a passivation layer, covering the semiconductor barrier layer;
   a first gate electrode and a second gate electrode, laterally separated from each other, and at least a portion of the first gate electrode and at least a portion of the second gate electrode respectively disposed in the passivation layer, wherein along a first direction, a first gate length of the first gate electrode is less than a second gate length of the second gate electrode;
   a source electrode and a drain electrode, disposed on the semiconductor channel layer, wherein the second gate electrode is electrically connected to the source electrode, and the first gate electrode and the second gate electrode are electrically isolated from each other; and
   a gate dielectric layer, disposed between the first gate electrode and the semiconductor barrier layer, and disposed between the second gate electrode and the semiconductor barrier layer,
   wherein the first gate electrode fills up a first trench in the passivation layer, the second gate electrode fills up a second trench in the passivation layer, and the gate dielectric layer is disposed in both the first trench and the second trench.

2. The semiconductor device of claim 1, wherein the first gate length is in a range of 0.1 micrometers (μm) to 2 μm.

3. The semiconductor device of claim 1, wherein the second gate length is in a range of greater than 2 μm to 5 μm.

4. The semiconductor device of claim 1, wherein the first gate electrode is located between the source electrode and the second gate electrode, and the second gate electrode is located between the first gate electrode and the drain electrode.

5. The semiconductor device of claim 1, wherein the gate dielectric layer is further conformally disposed on a top surface of the passivation layer.

6. The semiconductor device of claim 1, wherein the composition of the passivation layer comprises silicon nitride, and the composition of the gate dielectric layer comprises silicon oxide, silicon nitride, yttrium oxide, yttrium titanium oxide, ytterbium oxide, hafnium oxide, zirconium oxide, titanium oxide, aluminum oxide, tantalum oxide or a combination thereof.

7. The semiconductor device of claim 1, wherein the first gate electrode constitutes a gate of a normally-off transistor, the second gate electrode constitutes a gate of a normally-on transistor, and a drain of the normally-off transistor is electrically connected to a source of the normally-on transistor.

8. The semiconductor device of claim 7, wherein a withstand voltage of the normally-on transistor is greater than or equal to 600 volts.

9. The semiconductor device of claim 1, wherein a first distance between the first gate electrode and the source electrode is less than a second distance between the second gate electrode and the drain electrode.

10. The semiconductor device of claim 9, wherein a third distance between the first gate electrode and the second gate electrode is in a range of 2 μm to 4 μm, and the first distance is in a range of 2 μm to 4 μm.

11. The semiconductor device of claim 1, wherein the semiconductor barrier layer has a flat top surface, and the first gate electrode and the second gate electrode are disposed on the flat top surface.

12. The semiconductor device of claim 1, wherein the first gate electrode comprises a first portion in the passivation layer and a second portion above the passivation layer, the second gate electrode comprises a third portion in the passivation layer and a fourth portion above the passivation layer, the second portion and the fourth portion are laterally separated from each other, and along the first direction, a length of the second portion is less than a length of the fourth portion.

13. The semiconductor device of claim 1, wherein the composition of the semiconductor channel layer comprises gallium nitride (GaN), and the composition of the semiconductor barrier layer comprises aluminum gallium nitride (AlGaN).

14. The semiconductor device of claim 1, wherein the first gate electrode and the second gate electrode have the same composition.

15. The semiconductor device of claim 1, wherein the first gate electrode and the second gate electrode have different compositions.

16. The semiconductor device of claim 1, wherein the second gate electrode, the source electrode and the drain electrode have the same composition.

17. The semiconductor device of claim 1, wherein the source electrode and the second gate electrode are electrically coupled to a ground terminal.

18. The semiconductor device of claim 1, wherein the first gate electrode is a control gate.

19. The semiconductor device of claim 18, wherein a distance between the second gate electrode and the drain electrode is less than a distance between the first gate electrode and the drain electrode.

* * * * *